(12) United States Patent
Kabasawa

(10) Patent No.: US 6,720,563 B1
(45) Date of Patent: Apr. 13, 2004

(54) ION IMPLANTATION APPARATUS AND ION IMPLANTATION METHOD

(75) Inventor: Mitsuaki Kabasawa, Saijo (JP)

(73) Assignee: Sumitomo Eaton Nova Corporation, Tokyo (JP)

( * ) Notice: Subject to any disclaimer, the term of this patent is extended or adjusted under 35 U.S.C. 154(b) by 209 days.

(21) Appl. No.: 09/629,618

(22) Filed: Jul. 31, 2000

(30) Foreign Application Priority Data

Jul. 30, 1999 (JP) .......................................... 11-216626

(51) Int. Cl.⁷ .......................... H01J 37/08; A61N 5/00; G21C 5/00
(52) U.S. Cl. .............................. 250/492.21; 250/492.2; 250/492.23; 250/492.3; 250/492.1
(58) Field of Search ........................ 250/492.2, 492.21, 250/281–284, 288, 288.1, 294, 295, 297, 298, 423 R; 315/111.81, 541, 505; 324/466, 459, 464

(56) References Cited

U.S. PATENT DOCUMENTS

| | | | |
|---|---|---|---|
| 4,536,652 A | * 8/1985 | Cooks et al. | 250/281 |
| 4,682,026 A | * 7/1987 | Douglas | 250/288 |
| 5,130,552 A | * 7/1992 | Bright et al. | 250/492.2 |
| 5,244,820 A | * 9/1993 | Kamata et al. | 438/514 |
| 5,552,599 A | * 9/1996 | Giessmann et al. | 250/281 |
| 5,572,024 A | * 11/1996 | Gray et al. | 250/288 |
| 5,783,823 A | * 7/1998 | Mous et al. | 250/281 |
| 5,883,391 A | * 3/1999 | Adibi et al. | 250/492.21 |
| 5,932,882 A | * 8/1999 | England et al. | 250/492.21 |
| 5,969,366 A | * 10/1999 | England et al. | 250/492.21 |
| 6,031,379 A | * 2/2000 | Takada et al. | 324/466 |
| 6,087,615 A | * 7/2000 | Schork et al. | 219/121.43 |
| 6,130,436 A | * 10/2000 | Renau et al. | 250/492.21 |
| 6,137,112 A | * 10/2000 | McIntyre et al. | 250/492.21 |
| 6,313,475 B1 | * 11/2001 | Renau et al. | 250/492.21 |
| 6,319,734 B1 | * 11/2001 | Matsuda | 438/14 |
| 6,441,382 B1 | * 8/2002 | Huang | 250/492.21 |
| 2002/0089288 A1 | * 7/2002 | Keller | 315/111.81 |
| 2002/0100880 A1 | * 8/2002 | Chen et al. | 250/492.21 |

FOREIGN PATENT DOCUMENTS

| | | | | |
|---|---|---|---|---|
| GB | 2343545 A | * | 10/2000 | .......... H01J/37/317 |
| JP | 404101400 A | * | 4/1992 | ................. 315/503 |
| JP | 04282547 A | * | 10/1992 | .......... H01J/37/317 |
| JP | 405182795 A | * | 7/1993 | ................. 315/505 |
| JP | 11329316 A | * | 11/1999 | .......... C23C/14/48 |
| JP | 2000100372 A | * | 4/2000 | .......... H01J/37/317 |
| JP | 2000174266 A | * | 6/2000 | |
| JP | 2001043823 A | * | 2/2001 | ............ H01J/37/05 |

OTHER PUBLICATIONS

IBM Technical Disclosure Bulletin vol. 20/10, 3886–3888, "Ion Beam Size Analyzer", Mar. 1978, TDB-ACC-NO: NN78033886.*

* cited by examiner

Primary Examiner—John R. Lee
Assistant Examiner—Bernard Souw
(74) Attorney, Agent, or Firm—Arent Fox, Kintner Plotkin Kahn

(57) ABSTRACT

In an ion implantation apparatus, a reduction of an energy contanimination is achieved when ions are implanted into a wafer with a low energy. A beam transportation efficiency between mutually different positions on a beam line correlates with the energy contamination of the wafer, and the beam transportation efficiency is adjusted so that the energy contamination becomes small. Since the beam transportation efficiency is obtained by measuring a beam electric current at each position, the beam transportation efficiency can be obtained before the ions are implanted into the wafer.

24 Claims, 3 Drawing Sheets

ION IMPLANTATION APPARATUS AND ION IMPLANTATION METHOD

BACKGROUND OF THE INVENTION

1. Field of the Invention

The present invention relates to an ion implantation apparatus and an ion implantation method, both of which are necessary to implant an ion beam from an ion source into a wafer.

2. Description of the Related Art

Generally, an ion implantation apparatus of this kind has an ion source, an acceleration and extraction electrode section, a mass analysis unit FIG. 3, an acceleration/deceleration unit, a wafer processing chamber, and the like, all of which are disposed along a beam transportation path. Such an ion implantation apparatus is used for implanting ions into a wafer, such as semiconductor wafer (hereafter, referred to merely as wafer).

Recently, a semiconductor device trends to increase its density and raise its degree of integration. In order to realize such a high integrated semiconductor device, a technique is required for forming a shallow junction within the wafer. Formation of such a shallow junction brings about necessity of an ion implantation apparatus which is capable of implanting an ion into the wafer with very low energy (less than 5 KeV, preferably below 1 KeV).

On implanting ions with very low energy ions, a method is conventionally adopted to obtain a sufficient beam electric current. In this method, initially an ion beam is extracted with higher energy than desired. Then, the energy of the beam is decreased by decelerating the beam by the use of a deceleration electrode (will be simply referred to as decel) adjacent to the wafer after an ion mass is analyzed.

SUMMARY OF THE INVENTION

According to inventors' expenmental studies, it has been found out that ions with undesirable energy are implanted into the wafer and give rise to serious energy contamination, when the ions are implanted into the wafer with very low energy with the conventional deceleration method. Here the "energy contaminant" is defined as a particle that is the same kind of element as a desired ion but has different energy from the desired ion. Such a contaminant particle reaches to a deeper position of the wafer than desired. If the concentration of the contaminant particles exceeds a criterion (typically $1E18/cm^3$; depends on the structure of a semiconductor device), the juncton depths are determined not by desired ions but by the energetical contaminant particles. Therefore, it is important to decrease the amount of the energy contamination. Because the concentration of the desired ions is fixed at an appropriate value to achieve good device performance, the only way to reduce the amount of the energy contamination is to reduce the ratio of the energy contamination. Here the energy contamination ratio is defined as a ratio of the number of particles implanted with an incorrect energy to the number of ions implanted with the correct energy.

For such reasons, practical use might have not been realized yet about an ion implantation apparatus which is suitable for forming the shallow junction.

It is an object of the invention to realize an ion implantation apparatus which is suitable for forming a shallow junction.

It is another object of the invention to provide an ion implantation apparatus of the type described, which is capable of reducing an occurrence of an energy contamination.

It is still another object of the invention to provide an ion implantation method which is capable of implanting very low energy ions into a wafer, with a contamination reduced.

An ion implantation apparatus to which the present invention is applicable comprises an ion source, an extraction electrode section, a mass analysis unit, a mass analysis slit and a wafer processing chamber. By means of an embodiment of the invention, the ion implantation apparatus is constituted such that an ion implantation is controlled on the basis of a relationship between a beam transport efficiency of an ion beam and an energy contamination ratio in a wafer, and, as a result, the energy contamination ratio in the wafer can be reduced.

Further, an ion implantation apparatus with another embodiment of the invention comprises a deceleration device within a beam line to decelerate the ion beam. With this structure, the decelerated ion beam is controlled on the basis of the relationship between the beam transport efficiency and the energy contamination ratio. in this case, the deceleration capability is optimized on the basis of a measurement of the beam transport efficiency between the deceleration electrode section and the wafer before an implant. Specifically, the energy contamination ratio can be kept less than an allowable value on the basis of an inverse proportional relation between the beam transport efficiency from the deceleration electrode section to the wafer and the energy contamination ratio. The above energy transport efficiency can be measured by two Faraday cups. One is located just after the deceleration electrode section and the other is located just after the wafer. Such measurement of the energy transport efficiency is carried out prior to the beginning of an ion implantation process.

The ion implantation apparatus according to yet another embodiment of the invention is constituted such that a measured value of the beam transport efficiency is compared with a predetermined allowable lower limit. As a result of the comparison, the ion implantation is stopped if the measured value is less than the lower limit. in addition, an equipment for tuning or adjusting both the ion source and a beam transport system is installed.

Further, when the measured value of the beam transport efficiency is insufficient and the implantation process is inhibited from starting, an error message is displayed on the screen of a control computer. Then both of the ion source and the beam transport system are automatically tuned again.

The above-mentioned tuning unit for beam transport includes the mass analysis slit which is selectable in width and which serves to adjust mass resolution. The width selectable slit can work as the deceleration electrode when the decel voltage is supplied to this slit.

The tuning unit for tuning the beam transport system comprises mass analysis magnet as well. The mass analysis slit is automatically set to the minimum width and the beam axis is adjusted by changing a coil electric current of the mass analysis magnet. If this beam axis is shifted from the designed position, the beam transport efficiency is decreased.

As readily understood from the above, the invention measures the beam transport efficiency prior to the beginning of implanting the ion into the wafer, and a predetermined allowable lower limit which corresponds to an allowable energy contamination ratio can be set in each recipe for each implantation.

DESCRIPTION OF THE PREFERRED EMBODIMENTS

Figure 1:
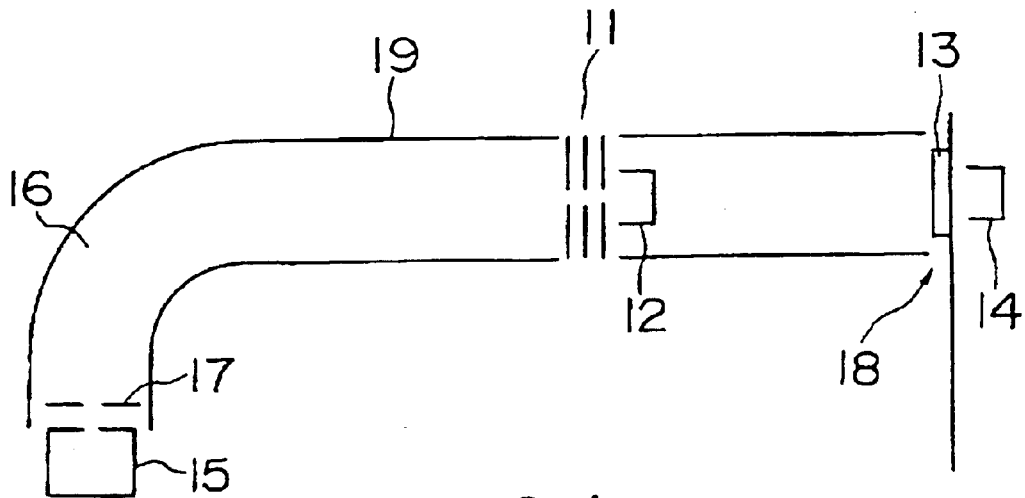
FIG. 1 is a schematic view for explaining an ion implantation apparatus to which the invention can be applied.

Referring to FIG. 1, description will be made about a schematic constitution of an ion implantation apparatus to which the invention is applicable, together with a principle of the invention. First, the illustrated ion implantation apparatus comprises an ion source 15, an extraction and acceleration electrode section 17 (will be simply called an extraction electrode section hereinafter), a mass analysis unit or analyzer 16, a mass analysis slit 11, a wafer processing chamber 18, a Faraday flag or cup 12 and a Faraday disc or cup 14. With this structure, a beam emitted from the ion source 15 is transmitted through a designed path, that is the beam line, to a wafer 13 located in the wafer processing chamber 18.

In case of the ion implantation apparatus shown in the drawing, the mass analysis slit 11 is used also as a deceleration unit for decelerating the beam. In the illustrated example, the Faraday flag 12 is disposed behind the mass analysis slit 11 while the Faraday disc 14 is disposed behind the wafer 13.

Incidentally, this invention can be applied to an ion implantation apparatus which has no deceleration unit and which performs no deceleration.

In as much as the mass analysis unit 16 has a mass-analysis electromagnet, the desirable orbit of the ion beams extracted from the ion source 15 by the extraction electrode 17 is separated and selected by the mass-analysis electromagnet according to the ion's momentum and charge. In other words, each orbit is determined by each species of the ions. Thus, only the desirable ions are transported in the form of an ion beam to the mass analysis slit 11 through an intermediate region 19.

While the ion beam passes through the intermediate region 19 extends through the outlet of the mass-analysis electromagnet to the mass analysis slit 11, a part of the ions obtains electrons from residual gas molecules and atoms and is neutralized by charge-exchange collisions with them. Because the neutralized ions are not influenced by a deceleration electric field, they pass through the mass analysis slit 11 and reach the wafer without any deceleration. As a result, the neutralized ions are implanted into the wafer having a high energy intact.

In addition, it has been confirmed that the neutralized atoms are implanted as dopants into deeper positions than desired ions and, as a result, become the energy contaminatibon.

The neutralized ions implanted undesirably deeper than the plan are detrimental to forming the shallow junction. A shallow implantation can not be achieved when a large quantity of energy contamination takes place within the wafer. This is because a depth of a junction is determined by the contamination component, even if the desired ions are shallowly implanted with very low energy.

Although an allowable concentration of the energy contamination depends on both a structure and a process of manufacturing a semiconductor device, the upper limit of it is estimated to be in the order of $1E18/cm^3$. Because the desirable dopant concentration is fixed at an appropriate value to achieve good device performance, the ratio of energy contamination to the correctly implanted ions should be reduced in order to decrease the concentration of energy contamination. This ratio is equal to the ratio of the number of neutralized particles to that of normal ions.

Conventional thoughts are that an amount of the energy contamination depends on a distance from the analysis electromagnet to the deceleration electrode 11 and a degree of vacuum in this zone.

However, according to experiments of the present inventors, it was found out that the ratio of the energy contamination correlates with a beam transmission efficiency within the beam path located from the decel electrode 11 to the wafer 13. This shows that the ratio of the energy contamination mainly depends on a travel distance of the beam after the deceleration, a degree of charge-up after the deceleration, a convergence-divergence action on the deceleration, tunings of the ion source and the mass-analysis electromagnet, and the like.

Accordingly, this means that the ratio of the energy contamination changes every time when the beam is tuned, even if the pressure in the zone 19, where the neutral particles are created, does not change.

Heretofore, since nothing has been taken into consideration about a relation between the ratio of the energy contamination on implantation and the transport efficiency of the ion beam, it is actually impossible to estimate the energy contamination prior to the implantation. Therefore, such a method is adopted that is an actual depth profile is actually measured and analyzed for a long time by arranging a monitor wafer for monitoring the contamination into production wafers. However, this method has a disadvantage in that a considerable number of production wafers has been wasted before any defect is found out and the ion implantation processes are stopped.

A principle of the invention is to reduce a ratio of the energy contamination by previously measuring a transport efficiency of the ion beam from the decel electrode to a wafer and the energy contamination and by controlling it based on the correlation between the ratio of energy contamination and the transport efficiency of the ion beam.

Figure 2:
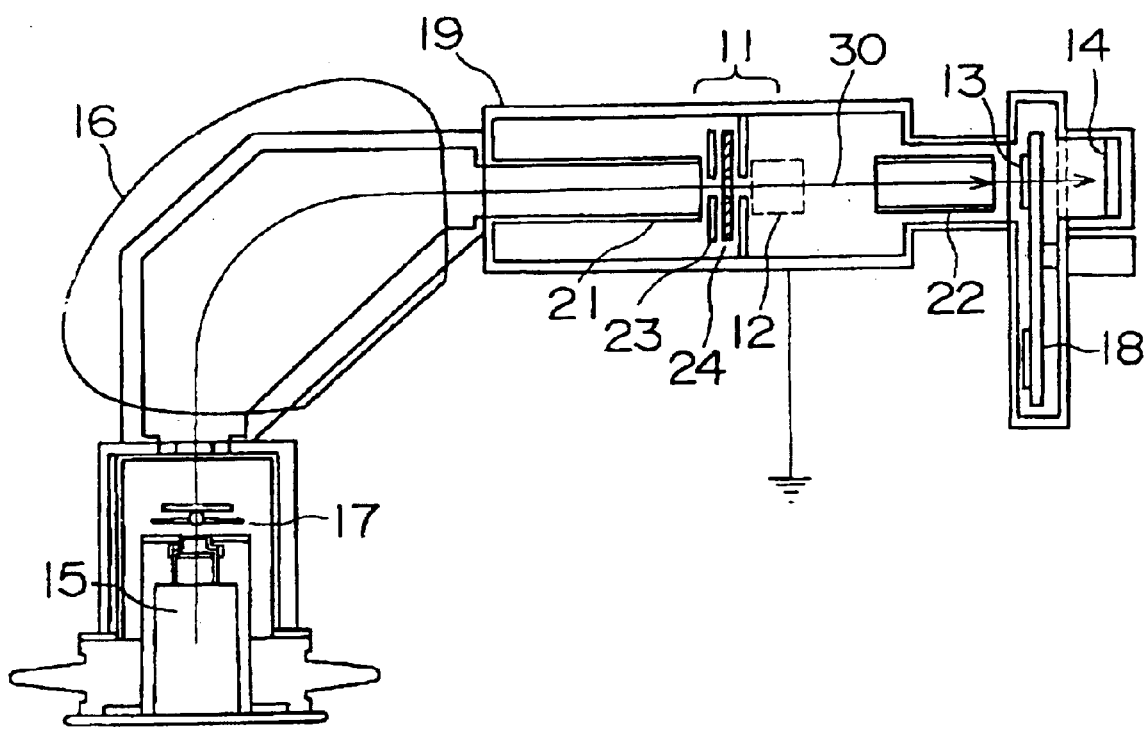
FIG. 2 is a view showing an example of an ion implantation apparatus in which the invention is installed.

Referring to FIG. 2, an ion implantation apparatus according to one embodiment of the invention comprises, like in FIG. 1, the ion source 15, the extraction electrode section 17, the mass analysis unit (electromagnet for mass analysis) 16, the mass analysis slit 11, and the wafer processing chamber 18. The illustrated intermediate region 19 has beam pipes 21 and the deceleration unit (decel) 11 for decelerating the beam. The decel 11 section has a mass analysis slit (decel electrode) 23 and a election-suppressor electrode 24. Similarly to FIG. 1, the Faraday flag 12 is disposed just after the deceleration section 11 as a first measurement unit while the Faraday disc 14 is disposed as a second measurement unit after the wafer disc which mounts a batch of wafers 13. In the example shown in the drawing, the ion beam from the ion source 15 is transferred to the wafer 13 in the wafer processing chamber 18 along the designed path (center orbit of a desired ion beam), i.e., a designed beam line 30.

Here a dopant distribution by a decel implantation is explained in detail for an example where a boron beam of n KeV is extracted from the ion source 15 and is decelerated to one tenth (n/10 KeV) by the deceleration electrode 24 and implanted into the silicon wafer 13.

Figure 3:
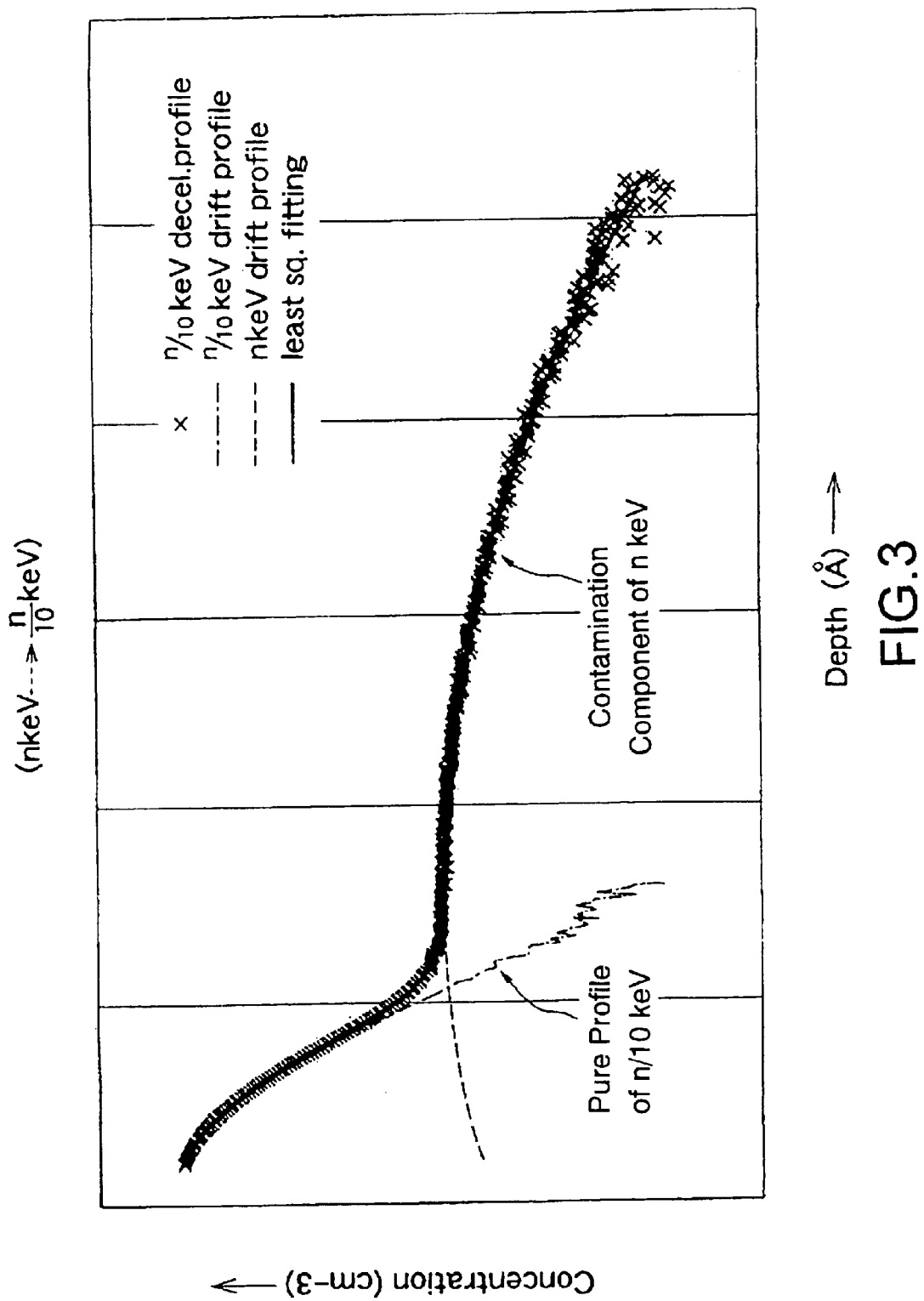
FIG. 3 is a diagram for showing a depth profile (dopant distribution from the surface of a wafer) which is achieved by a deceleration implantation.

Referring to FIG. 3, there is shown a profile representing a typical measured concentration of Boron atoms in the wafer 13 by a method of SIMS (Secondary ion Mass Spectroscopy).

It is understood from FIG. 3 that the profile of the deceleration implantation can be separated into a component of n/10 KeV and a component of n KeV that is a contamination component. Further, it is understood that the contamination component partially overlaps with a target or desired dopant component at a shallow position of the wafer, and reaches to a deeper position from the surface of a wafer deeper than that of the desired dopant component.

Such a profile measurement and component separation as mentioned above have been performed for various cases where the beam transport efficiencies were different. As a result, it has been found out that the energy contamination component is correlated with the beam transport efficiency from the deceleration electrode section 11 to the wafer.

Figure 4:
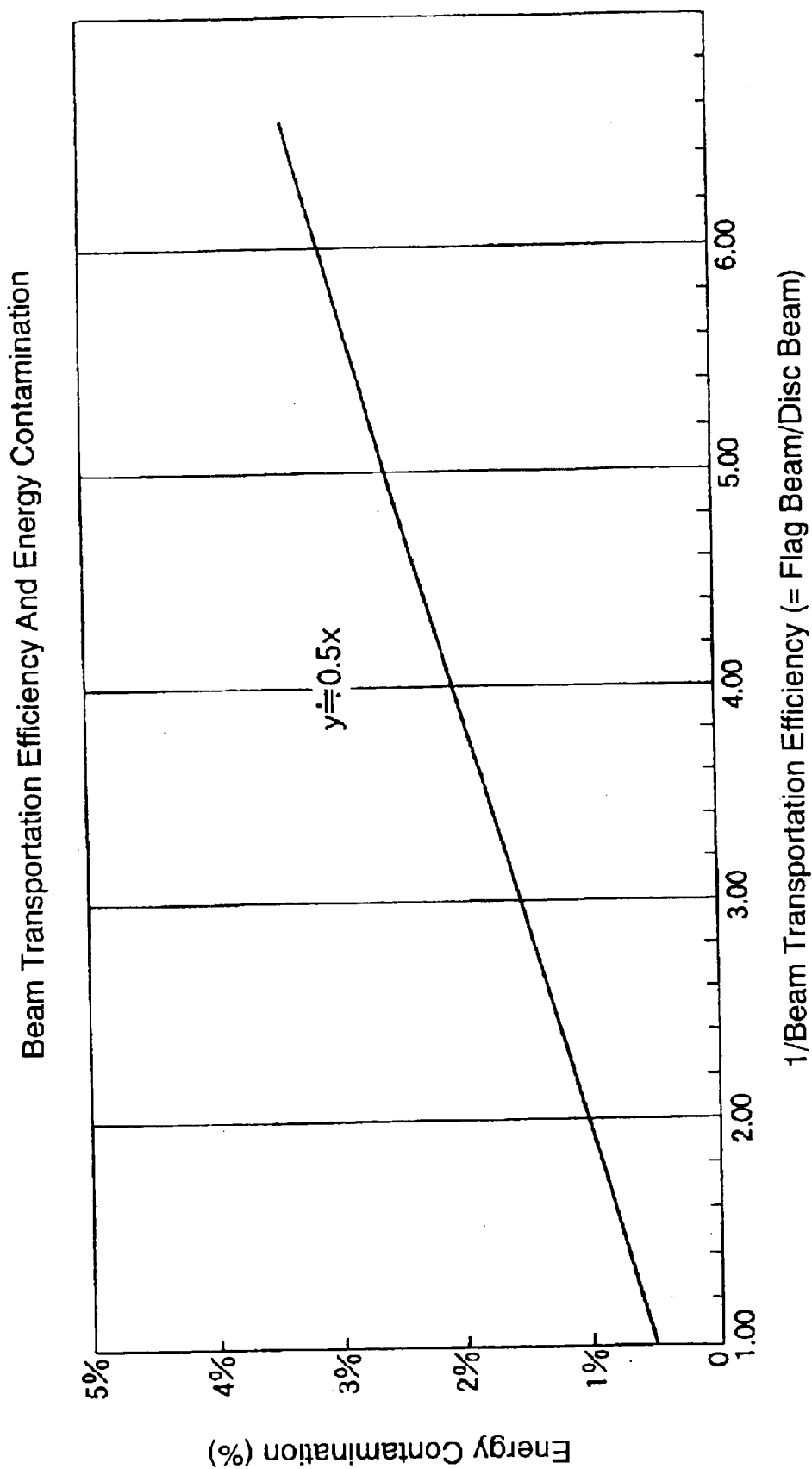
FIG. 4 is a diagram showing a relationship between a beam transport efficiency and an energy contamination ratio.

The correlation between the beam transport efficiency and the energy contamination is shown in FIG. 4. In FIG. 4, an abscissa and an ordinate represent a reciprocal of the beam transport efficiency and a ratio (%) of the energy contamination, respectively. As apparent also from this figure, it is understood that a very strong correlation exists between the reciprocal of the beam transport efficiency and the ratio of the energy contamination. Although the reciprocal of the beam transport efficiency is taken along the abscissa, it is needless to say that, in case where the beam transport efficiency itself is adopted, there is a correlation of inverse proportion between the beam transportation efficiency and the ratio of energy contamination.

The energy contamination is mainly generated by neutralization of ions in a linear zone from an outlet of the mass-analysis electromagnet (mass analyzer) 16 to the decel electrode section 11 including the mass analysis slit.

Here, it is supposed that an electric current value of the ion beam coming into this zone is given by $I_{IO}$ and the neutralized ion beam is represented by $I_{NO}$. When the neutralization rate is not so large, the intensity of the neutralized beam is proportional to the intensity of the original ion beam and is given by.

$$I_{NO} = \alpha I_{IO} \quad (1)$$

The proportional coefficient a is representative of the neutralization rate and, in principle, depends on a length, a degree of vacuum, a kind of residual gas, an ion species and an ion beam energy in the above zone.

Herein, it is assumed that the above-mentioned ion beam and neutralized ion flux are implanted into the wafer with corresponding electric current values $I_{ID}$ and $I_{ND}$, respectively. In this case, a ratio $C_{Ene}$ of the energy contamination ratio is defined by a following formula.

$$C_{Ene} = I_{ND}/I_{ID} \quad (2)$$

Let the transport efficiency of the neutralized beam to the disc Faraday be represented by $\epsilon_N$. A relation between the $I_{NO}$ and the $I_{ND}$ is expressed by a following formula.

$$I_{ND} = \epsilon_N I_{NO}$$

From these relations, the quantity of the energy contamination is expressed as follows.

$$C_{Ene} = \alpha \epsilon_N (I_{iO}/I_{iD}) \quad (4)$$

The $I_{iO}/I_{iD}$ is a reciprocal of the beam transport efficiency from the analyzer outlet to the wafer. Accordingly, if α and $\epsilon_N$ are constant, the ratio of the energy contamination is approximately in inverse proportion to the beam transport efficiency. Further, the transport efficiency $\epsilon_N$ of the neutralized beam is almost determined only by a width of the mass analysis slit and, as a result, becomes constant as long as the beam has low energy, and does not depend on a tuned beam. From the above facts, a proportionality, expressed by the formula (4), is assured between the ratio of energy contamination and the reciprocal of the beam transport efficiency from the analyzer outlet to the wafer.

Instead of $I_{iO}$, a beam electric current $I_{if}$ measured at the flag Faraday 12 which is a first Faraday cup just after the decel electrode section can be used. If $\epsilon_{iI}$ is representative of the beam transport efficiency (mostly determined by a passage rate of the mass analysis slit 23) from the analyzer outlet to the Faraday flag 12, a relation between these current $I_{iO}$ and $I_{NF}$ is expressed by a following formula.

$$I_{if} = \epsilon_{iI} I_{IO} \quad (5)$$

Further, a beam electric current $I_{ID}$ implanted into the wafer is equal to a beam electric current measured at the Faraday disc 14 which may be called a second Faraday cup. Accordingly, an actually used formula becomes:

$$C_{Ene} = (\alpha \epsilon_N / \epsilon_{iI})(I_{iF}/I_{iD}) \quad (6)$$

In Equation (6), the term $I_{if}/I_{iD}$ is a reciprocal [(I/Ei2)] of the beam transport efficiency from the Faraday flag 12 to the Faraday disc 14.

In order to use the formula (6) for a contamination control, $\epsilon_{iI}$ must seem to be constant. Although it is possible that $\epsilon_{iI}$ is affected by the tuning of the ion beam, $\epsilon_{iI}$ is almost constant as long as the ion beam focuses on the mass analysis slit. This focusing property can be confirmed by the beam current at the Faraday flag 12. Measured beam current by this Faraday becomes maximum when the beam is focused on the mass analysis slit 23. Thus, the energy contamination ratio $C_{Ene}$ is proportional to a reciprocal of the beam transmission efficiency $I_{if}/I_{iD}$ under the condition of normal beam tuning.

In FIG. 4, a proportional relation is illustrated between the $C_{Ene}$ and the $I_{iF}/I_{iD}$. It is understood that the energy contamination can be controlled in accordance with the formula (6). For example, in order to reduce energy contamination ratio to 1% or less, the beam transport efficiency should be higher than 50% (the reciprocal of the beam transport efficiency should be less than 2.0).

In the formula (6), $C_{Ene}$ is representative of the energy contamination ratio obtained by decomposing a depth profile of the decel implantation into the drift component (i.e., pure dopant component) and the contamination component and by taking an area ratio between them. The reciprocal of the beam transport efficiency $I_{VF}/I_{ID}$ is obtained by means of dividing a measured ion beam current of the flag Faraday 12 in FIG. 2 by a measured ion beam current of the disc Faraday 14.

Accordingly, in order to suppress the energy contamination lower than the target value (1% as an example), it suffices that the beam transport efficiency from the deceleration electrode section 11 to the wafer 13 is made larger than a correlation value (50% as an example) of the beam transport efficiency corresponding to the target value of energy contamination ratio. To the contrary, when the beam transport efficiency does not exceed the correlation value of the beam transport efficiency corresponding to the target value of the energy contamination ratio, it is possible to avoid the energy contamination exceeding an allowable amount by interlocking the transport efficiency with a start signal of an implant process.

If the desired ion beam can be increased or the neutral component in the ion beam can be decreased, the beam transport efficiency is made larger than a certain correlation value (50% as an example) and the energy contamination can be reduced to the target value (1% as an example).

As mentioned before, the ion implantation apparatus comprises the ion source 15, the extraction electrode 17, the mass analysis electromagnet unit 16, the mass analysis slit 23, the wafer processing chamber 18, and the like. Under the circumstances, the neutral component in an ion beam must be controlled so that its ratio to the ion beam becomes below the higher limit of energy contamination ratio. This requirement is automatically met as long as the beam transport efficiency is kept higher than the lower limit which corresponds to the higher limit of the energy contamination ratio.

Here the method to keep a high level of the beam transport efficiency is described in detail with reference to FIG. 2. The beam transport efficiency is measured by the Faraday flag 12 (the first measurement unit) being placed just after the deceleration electrode section 11 and by the Faraday disc 14 (the second measurement unit) being placed just after the wafer disc. A scanning operation during an implantation process can be performed by moving the wafer disc in an up-and-down direction in FIG. 2 and, in this operation, the wafer disc is preliminarily moved to a position displaced from the beam line 30. Under this state, since the ion beam is not implanted into the wafer 13, the measurement is performed by the first and second measurement units. The beam transport efficiency is derived from dividing the beam current at the Faraday disc 14 by that of the Faraday flag 12. Thus, it is judged prior to the ion implantation whether or not the measured beam transport efficiency reaches the specified lower limit (default value is 50%, as an example). If it does not reach the specified value, the implantation processes are not permitted to start. The specified value can be included into a recipe of an implant process.

By adjusting the ion source 15 and the mass analyzer 16 again, the beam transport efficiency is improved to some extent. Therefore, when the implantation process cannot start, a message demanding to adjust the ion source 15 and the mass analyzer 16 again is displayed simultaneously on an operator interface screen. In a sophisticated machine, these steps are performed automatically.

Incidentally, as an example of measuring the transport efficiency, a method utilizing the Faraday cups is described here. However, any other system can be used to measure the beam transport efficiency, for example, a line type sensor, a system directly detecting the electric current from a wafer surface disc.

The deceleration components 11, which decelerate an ion beam may be separately provided behind or in front of the mass analysis slit 23. The mass analysis slit 23 is selectable in width by automatically picking up a suitable one in a stepwise manner from a line of slots that are different in width. The suitable slit is selected generally in compliance with a mass resolving power required for each ion kind. This mass analysis slit 23 is used to reduce energy contamination as well.

Among the slits with various width, one such as having the minimum width is automatically selected. Because the direction of the beam axis is controlled by the coil current of the mass analyzer 16, the beam current is measured by the Faraday flag 12 with varying the coil current. When the measured beam current becomes maximum, the beam axis is lying on the designed center orbit. Then the beam transport efficiency becomes maximum too.

A measurement of the ion transport efficiency and a judgment to start an ion implantation process is carried out automatically by a control program of the apparatus. This program measures the beam transport efficiency with reference to the lower limit of it in the process recipe and judges whether it exceeds the lower limit or not. In the case where the efficiency is insufficient, the ion implantaton process is not permitted to start, and an error message may be displayed on an operator interface screen.

In this case, it is also possible to automatically start tuning of the ion source 15 and the mass analyzer 16 by being linked with a program for auto-beam-tuning.

In a deceleration implantation, if the implantation is performed through the slit of a maximum width, this system has a problem that a center axis of the beam is difficult to be adjusted precisely. However, by means of automatically selecting the slit width to the minimum only for the precise alignment of the beam center axis by varying the coil electric current of the mass analyzer, it is possible to increase the beam transport efficiency. The widest slit is chosen again to start decel implantation process after the adjustment of the beam axis.

As mentioned above, the method according to the invention comprises the steps of adjusting the energy contamination ratio in the ion implantation apparatus comprising the ion source, the extraction electrode, the mass analysis unit, the mass analysis slit, the wafer processing chamber, and the like. Concretely to say the adjustment of the energy contamination ratio is performed by controlling the ion implantation process on the basis of the relation between the transport efficiency of the ion beam and the energy contamination ratio in the wafer.

In other words, it may be constituted such that, the deceleration unit is used to implant ions by providing ions in the beam line, the implantation processes are controlled on the basis of the relation between beam transport efficiency and the energy contamination ratio. The deceleration unit is composed of a deceleration electrode, an electron suppression electrode and a ground electrode and can be constituted so that the energy contamination ratio does not exceed an allowable value, on the basis of the inverse proportion relation mentioned above.

The beam transport efficiency is measured before the implantation processes are started, by providing the Faraday cups placed just after the deceleration electrode section and just after the wafer. Further, a measured value of the beam transport efficiency is compared with a predetermined allowable lower limit, and the implantation processes are inhibited from starting in case where the beam transport efficiency does not exceed the lower limit.

In this case, an error message is displayed on the operator interface screen. In addition, the ion source and the beam transportation system may be automatically tuned again. It is also possible to tune the beam transport efficiency by utilizing the ion source and a beam transportation system.

When tuning the beam transportation system, it is also possible to adjust the beam by putting the mass analysis slit into the slit system whose width is selectable and, further, the mass analysis slit may be used also as the deceleration electrode.

When the beam transportation system is being tuned, an axis alignment of the beam may be performed by automatically selecting a slit with the minimum width as the mass analysis slit, and by charging a coil electric current of the mass analyzer to make the beam current at the Faraday flag maximum.

Incidentally, the first Faraday flag may be provided just before the mass analysis slit or just behind the mass analysis slit besides it is provided just behind the deceleration electrode section. Also the second Faraday disc may be provided just behind the wafer disc or at a position just before the wafer disc.

By placing the Faraday flag 12 (the first measurement unit) just behind the deceleration electrode section 11 and placing the Faraday disc 14 (the second measurement unit) just behind the wafer disc, the beam transport efficiency between both the measurement units is measured. The beam transport efficiency is derived by dividing the electric current at the second measurement unit by that at the first one. This measurement is performed before the ions are implanted into the wafer, by displacing the wafer disc to a position deviated from the beam line and, under this state, using the first and second measurement bodies. It is judged whether or not a result of the measurement reaches the specified value (default is 500, as an example) becoming the allowable lower limit value and, if it does not reach the specified value, the implantation is stopped. The specified value can be set according to the recipe in compliance with the allowable quantity, with respect to the energy contamination, of an apparatus user.

By adjusting the ion source 15 and the analyzer 16 again, the beam transportation efficiency is improved in some extent. Therefore, simultaneously with the implantation stoppage, the message demanding to adjust the ion source and the analyzer again is displayed on the operator interface screen.

The deceleration electrode 24 applies the deceleration action to the ion beam, and it may be separately provided behind or in front of the mass analysis slit 23 and may be used also as the mass analysis slit 23. The mass analysis slit 23 for the ions is adapted such that the slit width of opening is automatically and stepwise changed in compliance with the mass resolving power necessary for each ion kind.

The mass analysis slit 23 for the ions automatically reduces the slit width to the minimum only when the beam center axis is aligned by oscillating the coil electric current of the analyzer.

According to the invention, it is possible to adjust the component proportion of the neutral beam in the beam at the intermediate convergent point of the beam or at a position before or after the mass analysis slit such that it becomes below a constant proportion and, by this, a maximum energy contamination quantity can be inferred. Further, in the invention, if the transportation efficiency from the intermediate convergent point of the beam or from the position before or after the mass analysis slit to the wafer is measured, is an actual energy contamination quantity can be inferred, so that the energy contamination can be controlled.

It is difficult to control the quantity of the energy contamination directly, but it is possible to control the ratio of energy contamination by the beam transport efficiency, and it is also possible to raise the beam transport efficiency by adjusting the center axis of the beam.

By the invention, the energy contamination that is implanted more deeply than the desired plan can be reduced. Accordingly, it is possible to avoid the disadvantage that a junction depth is determined by the implanted depth of the contamination component, and it is possible to keep the ratio of the energy contamination below the higher limit.

By improving the beam transport efficiency after the deceleration, it is possible to control the ratio of the energy contamination changing every time the tuning of the beam is performed, by means of utilizing the fact that the ratio of the energy contamination largely depends on a travel distance of the beam after the deceleration, a degree of the charge-up after the deceleration, a convergence-divergence action at the time of decelerations, tunings of the ion source and the analysis electromagnet, and the like.

What is claimed is:

1. An ion implantation apparatus for use in implanting an ion beam into a wafer by conducting the ion beam to the wafer along a predetermined path, the ion implantation apparatus comprising:
    means for measuring, along the predetermined path, beam electric currents at a plurality of measurement positions different from each other;
    means for obtaining a beam transport efficiency between the measurement positions from the beam electric currents measured at respective measurement positions to estimate a ratio of energy contamination specified by a neutralized ion beam and a desired ion beam both of which are implanted in the wafer, by using a correlation between the energy contamination and the beam transport efficiency.

2. The ion implantation apparatus as claimed in claim 1, the apparatus having an intermediate convergent point or a mass analysis slit for converging the beam within the predetermined path, wherein one of the measurement positions is determined at a front or rear position of the intermediate convergent point or the mass analysis slit, the apparatus being adjusted at one of the measurement positions so that a ratio of the energy contamination is not higher than a predetermined value.

3. The ion implantation apparatus as claimed in claim 2, wherein the correlation is computed on the basis of a table which stores measurement data of a special correlation that is featured by an inverse proportion relation between the ratio of the energy contamination in the wafer and the beam transport efficiency.

4. The ion implantation apparatus as claimed in claim 3, further comprising means for measuring the correlation from an inverse proportion relation between the energy contamination and the beam transport efficiency.

5. The ion implantation apparatus as claimed in claim 1, the apparatus comprising an ion source, an analyzer, an ion deceleration electrode, and a wafer processing chamber, wherein measurement positions are determined at a rear portion of the ion deceleration electrode and an ion implantation position of the wafer processing chamber; wherein
    a beam transport efficiency being calculated from results measured at respective measurement positions.

6. The ion implantation apparatus claimed in claim 5, further comprising means for measuring the ratio of the energy contamination from a deceleration ratio which is defined by the ratio of implanted ion energy to the extracted ion energy.

7. An ion implantation method for use in an ion implantation apparatus comprising an ion source, an extraction electrode, a mass analysis unit, a mass analysis slit, and a wafer processing chamber, comprising the steps of:
    deciding a target value of energy contamination in a wafer;
    measuring, along a predetermined path, beam electric currents at a plurality of measurement positions different from each other to obtain a beam transport efficiency of an ion beam; and
    adjusting transport efficiency and the energy contamination.

8. The ion implantation method as claimed in claim 7, further comprising the steps of:
    obtaining the beam transport efficiency of the ion beam; and judging whether or not ion implantation is to be started by comparing the measured beam transport efficiency with a lower limit.

9. A method of implanting ions into a wafer, comprising the steps of:
setting a beam transport efficiency to a predetermined value;
decreasing a neutral fraction of the beam;
monitoring the beam transport efficiency; and
reducing an energy contamination to a value lower than a target value.

10. An ion implantation apparatus comprising an ion source, an extraction electrode, a mass analysis unit, a mass analysis slit, and a wafer processing chamber, the apparatus having a measurement point determined at an intermediate convergent point or at a front or rear position of the mass analysis slit and being controlled so that a neutral fraction of a beam becomes lower than a predetermined rate.

11. The ion implantation apparatus as claimed in claim 10, comprising a first Faraday cup that is located at a first position determined at a front or a rear position of either of intermediate convergent point and the mass analysis slit; a second Faraday cup that is located at a second position determined at a front or-rear position of a wafer;
means for measuring beam electric currents at the first and second positions to calculate a difference between the beam electric currents measured at the first and the second positions and to obtain a beam transport efficiency with reference to the difference.

12. The ion implantation apparatus as claimed in claim 10, wherein a deceleration unit is provided with a beam path of an ion beam, and an amount of ion implantation is controlled and adjusted on the basis of a relation between a beam transport efficiency obtained by the use of the deceleration unit and an energy contamination.

13. The ion implantation apparatus as claimed in claim 12, wherein the deceleration unit is composed of a deceleration electrode section;
the apparatus being controlled so that the energy contamination does not exceed an allowable amount on the basis of an inverse proportion relation between a beam transport efficiency from the deceleration electrode section to a wafer and the amount of the energy contamination.

14. The ion implantation apparatus as claimed in claim 13, comprising a first Faraday cup located just after the deceleration electrode section and a second Faraday cup located just after the wafer;
the beam transport efficiency before implantation into the wafer being measured by use of the first and second Faraday cups.

15. The ion implantation apparatus claimed in claim 11, wherein starting of implantation process is inhibited if a measured beam transport efficiency is less than a predetermined allowable lower limit.

16. The ion implantation apparatus as claimed in claim 10, further comprising:
means for tuning the ion source and a beam transport system.

17. An ion implantation apparatus as claimed in claim 10, further comprising:
means for comparing the measured beam transport efficiency with the predetermined allowable lower limit;
means for stopping the processing of the implantation in the case where the measured beam transport efficiency is less than the predetermined allowable lower limit;
means for displaying an error message in the case where the implantation is stopped and;
means for automatically starting the implantation process again by tuning the ion source and a beam transport system formed between the ion source and the processing chamber.

18. The ion implantation apparatus as claimed in claim 10, wherein the mass analysis slit is variable in width which can be used to precisely adjust a beam orbit when tuning a beam transport system formed between the ion source and the processing chamber.

19. The ion implantation apparatus as claimed in claim 12, wherein the mass analysis slit is used also as a deceleration electrode.

20. The ion implantation apparatus as claimed in claim 10, wherein the mass analysis slit is automatically adjusted to a minimum width to adjust a beam axis by changing electric current of a mass analyzing magnet coil included in the mass analysis unit.

21. The ion implantation apparatus as claimed in claim 12, wherein the beam transport efficiency is measured by a Faraday flag provided just after a deceleration electrode section and a Faraday disk provided just after a wafer.

22. The ion implantation apparatus as claimed in claim 10, wherein a beam transport efficiency is measured before the beam starts to impinge upon a wafer.

23. The ion implantation apparatus as claimed in claim 15, wherein a specified ratio of energy contamination is set in each implantation recipe, which is automatically converted to the limit of the beam transport efficiency.

24. An ion implantation apparatus, comprising:
a table for storing measured results in necessary beam electric current values on the basis of an inverse proportion relation between a beam transport efficiency for each ion species and an amount of an energy contamination; and
means for adjusting the energy contamination of ion implantation at each necessary beam electric current value, by using a limiting beam transport efficiency value obtained on the basis of the table.

* * * * *